United States Patent
Yun et al.

(10) Patent No.: US 9,236,279 B2
(45) Date of Patent: *Jan. 12, 2016

(54) METHOD OF DIELECTRIC FILM TREATMENT

(75) Inventors: Seokmin Yun, Pleasanton, CA (US); Ji Zhu, El Cerrito, CA (US); John M. deLarios, Palo Alto, CA (US); Mark Wilcoxson, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 1446 days.
This patent is subject to a terminal disclaimer.

(21) Appl. No.: 12/048,188

(22) Filed: Mar. 13, 2008

(65) Prior Publication Data

US 2009/0229638 A1   Sep. 17, 2009
US 2014/0048108 A9   Feb. 20, 2014

Related U.S. Application Data

(63) Continuation-in-part of application No. 11/347,154, filed on Feb. 3, 2006, now Pat. No. 7,696,141, which is a continuation-in-part of application No. 10/608,871, filed on Jun. 27, 2003, now abandoned.

(60) Provisional application No. 60/755,377, filed on Dec. 30, 2005.

(51) Int. Cl.
*B08B 3/04* (2006.01)
*H01L 21/67* (2006.01)
(Continued)

(52) U.S. Cl.
CPC .... *H01L 21/67051* (2013.01); *H01L 21/02063* (2013.01); *H01L 21/3105* (2013.01); *H01L 21/31058* (2013.01); *H01L 21/31138* (2013.01)

(58) Field of Classification Search
CPC ..................... H01L 21/02063; H01L 21/3105; H01L 21/31058; H01L 21/31138; H01L 21/67051; H01L 21/28247; H01L 21/823462; H01L 21/823468; H01L 29/6656; H01L 21/02052; H01L 21/02057; H01L 21/02096; B08B 7/02; C11D 17/0013; C11D 17/0017
USPC .............................................. 134/36, 902, 26
See application file for complete search history.

(56) References Cited

U.S. PATENT DOCUMENTS 6,488,040 B1   12/2002   de Larios et al. ............. 134/95.2
6,616,772 B2 *   9/2003   de Larios et al. ................ 134/21
(Continued)

FOREIGN PATENT DOCUMENTS

JP   2001-053044 A   2/2001
JP   2004-073919 A   3/2004
(Continued)

OTHER PUBLICATIONS

PCT International Search Report—PCT/US2009/035030—dated Jan. 4, 2010 (3 pages).

*Primary Examiner* — Douglas Lee
(74) *Attorney, Agent, or Firm* — Martine Penilla Group, LLP

(57) ABSTRACT

A method and system for cleaning a surface of a substrate after an etching operation includes determining a plurality of process parameters associated with the surface of the substrate. A plurality of application chemistries are identified based on the process parameters. The plurality of application chemistries includes a first application chemistry as an emulsion having a first immiscible liquid combined with a second immiscible liquid and solid particles distributed within the first immiscible liquid. The plurality of application chemistries including the first application chemistry are applied to the surface of the substrate such that the combined chemistries enhance the cleaning process by substantially removing the particulate and polymer residue contaminants from the surface of the substrate while preserving the characteristics of the features and of the low-k dielectric material through which the features are formed.

17 Claims, 8 Drawing Sheets

(51) Int. Cl.
*H01L 21/02* (2006.01)
*H01L 21/3105* (2006.01)
*H01L 21/311* (2006.01)

(56) References Cited

U.S. PATENT DOCUMENTS

| | | | |
|---|---|---|---|
| 6,773,873 B2 * | 8/2004 | Seijo et al. | 430/329 |
| 6,951,823 B2 * | 10/2005 | Waldfried et al. | 438/710 |
| 8,137,474 B2 * | 3/2012 | Freer et al. | 134/22.1 |
| 8,608,859 B2 * | 12/2013 | Freer et al. | 134/6 |
| 2002/0175071 A1 * | 11/2002 | Hymes | 204/198 |
| 2004/0072436 A1 * | 4/2004 | RamachandraRao et al. | 438/692 |
| 2004/0106531 A1 | 6/2004 | Kanno et al. | 510/175 |
| 2006/0014656 A1 * | 1/2006 | Egbe et al. | 510/175 |
| 2006/0128600 A1 * | 6/2006 | Freer et al. | 510/491 |
| 2007/0281083 A1 | 12/2007 | Lakshmanan et al. | |

FOREIGN PATENT DOCUMENTS

| | | | |
|---|---|---|---|
| JP | 2004-094203 | 3/2004 | G03F 7/42 |
| JP | 2007-184599 | 7/2007 | H01L 21/304 |
| JP | 2008-010610 | 1/2008 | H01L 21/768 |
| WO | WO 2000-014785 A1 | 3/2000 | |
| WO | WO 2008/088459 A1 | 7/2008 | H01L 21/306 |

* cited by examiner

US 9,236,279 B2

METHOD OF DIELECTRIC FILM TREATMENT

CLAIM OF PRIORITY

This application is a continuation-in-part application of U.S. patent application Ser. No. 11/347,154, filed Feb. 3, 2006, under 35 U.S.C. 120, and entitled "CLEANING COMPOUND AND METHOD AND SYSTEM FOR USING THE CLEANING COMPOUND," which issued as U.S. Pat. No. 7,696,141, on Apr. 13, 2010, which claimed priority under 35 USC 120 as a continuation-in-part of prior U.S. application Ser. No. 10/608,871, filed Jun. 27, 2003 (abandoned), and entitled "Method and Apparatus for Removing a Target Layer from a Substrate Using Reactive Gases," and claimed benefit of U.S. Provisional Application No. 60/755,377, filed Dec. 30, 2005.

FIELD OF THE INVENTION

The present invention relates generally to semiconductor substrate processing, and more particularly, to a method for cleaning a surface of a substrate after an etching operation.

BACKGROUND

Semiconductor devices are obtained through various fabrication operations. The fabrication operations define a plurality of features on semiconductor wafers (wafers or substrates) that span multiple levels. At the base level, plurality of transistor devices with diffusion regions is defined. In subsequent levels, interconnections using metal lines are defined and electrically connected to the underlying transistor devices resulting in semiconductor devices such as the integrated circuits (IC), memory cells, etc. Low-k dielectric materials are used to separate and insulate these features and other layers to obtain fully functional semiconductor devices. To provide better insulation between features and to further reduce coupling capacitance and power consumption, the dielectric constant of the low-k dielectric materials used is further reduced by introducing pores and by doping with chemicals such as carbon or fluorine. The resulting ultra low-k dielectric materials are good insulators, use less power, and result in reduced coupling capacitance.

During the various fabrication operations, the substrate is exposed to various contaminants. Any material or chemical used in the fabrication operations to which the substrate is exposed is a potential source of contamination. Chemicals, such as process gases, etching chemicals, deposition chemicals, etc., used in the various fabrication operations leave deposit on the surface of the substrate as particulates or polymer residue contaminants. The sizes of the particulate contaminants are in the order of the critical dimensions of the features being fabricated on the substrate. During fabrication, these contaminants lodge into hard-to-reach areas, such as in a trench surrounding delicate features. Conventional cleaning process use mechanical cleaning to clean the surface of these particulate and polymer residue contaminants. However, with technological advances leading to decreasing feature size, cleaning the surface using mechanical cleaning processes becomes quite challenging as the delicate features may get easily damaged. If the contaminants are not properly removed, the features in the vicinity of these contaminants may potentially become inoperable. Removal of such small contaminants without adversely affecting the features or the low-k material on the wafer is quite challenging.

Additionally, the ultra low-k dielectric material used in insulating features poses new challenges as the material properties, such as mechanical strength, thermal stability and adhesion to different substrate layers among others, are sometimes compromised. As the ultra low-k dielectric material is exposed to the rigors of the various fabrication operations, the dielectric material may get physically or chemically damaged by the process chemicals and/or by the fabrication processes. The damage may be due to depletion of carbon content from a portion of the ultra-low-k dielectric material immediately adjacent to the features and exposed to the process chemicals. The depletion of the carbon results in an increase of the dielectric constant in the dielectric film layer. During a stripping operation, for example, stripping plasma used to strip a carbon based photoresist layer near a feature, may damage the low-k material that is exposed to the stripping plasma by depleting the carbon from the low-k material. The carbon depletion in the low-k material results in an increase of the dielectric constant in the low-k dielectric film layer contributing to capacitive coupling. It is, therefore, essential to substantially restore the characteristics of the low-k dielectric film layer by either removing or repairing the damaged low-k dielectric film layers through which features are formed so that the functionality of the features and that of the integrated circuit devices, are preserved.

Additionally, metals have been used as conducting materials in integrated circuit production for a long time. Presently, tungsten is used at the front end to make contact with the transistors while aluminum and copper are the preferred metals for back end of the line interconnects. These metals are chemically very reactive and can react with moisture and oxygen in the ambient environment as well as other process chemicals applied to the surface leading to metal corrosion. The corrosion of metals will negatively impact the electrical integrity of the fabricated device, which necessitates metal passivation during the process flow.

It is clear from above that a most desired cleaning method should be able to perform multiple functions listed above, namely, particle removal, polymer residue removal, damaged low-k removal and repair, and metal passivation. It is in this context that embodiments of the invention arise.

SUMMARY

The present invention fills the need by providing an improved cleaning method for treating a surface of a substrate after an etching operation that provides multiple functionalities including particle removal, polymer residue removal, damaged low-k removal and repair, and metal passivation. It should be appreciated that the present invention can be implemented in numerous ways, including as an apparatus and a method. Several inventive embodiments of the present invention are described below.

In one embodiment, a method for cleaning a surface of a substrate after an etching operation is disclosed. The method includes determining a plurality of process parameters associated with the surface of the substrate. These process parameters define characteristics related to the surface of the substrate such as characteristics of the substrate surface to be cleaned, contaminants to be removed, features formed on the substrate and chemicals used in the fabrication operations, such as etching. Based on the assessment of the process parameters and process need, application chemistries can be identified and applied either combined or sequentially. For particle removal, the application chemistry includes an emulsion having a first immiscible liquid combined with a second immiscible liquid. The second immiscible liquid forms a plurality of droplets that is dispersed within the first immiscible liquid. The emulsion further includes solid particles distributed within the first immiscible liquid. For polymer residue removal, the application chemistry contains organic solvents that can swell and facilitate polymer residue removal. For damaged low-k removal, the application chemistry contains silicon oxide etchant. For damaged low-k repair, the application chemistry contains active silicon compounds. For metal passivation, the application chemistry contains polar function groups to interact with metal surfaces. The identified application chemistries are then applied to the surface of the substrate such that the combined chemistries enhance the cleaning process by substantially removing the particulate and polymer residue contaminants from the surface of the substrate while preserving the characteristics of the features and of the low-k dielectric material through which the features are formed.

In another embodiment of the invention, a system for cleaning a surface of a substrate after an etching operation is disclosed. The system includes a substrate supporting device to receive, support and transport the substrate through the system and a chemical delivery mechanism to deliver a plurality of application chemistries to the surface of the substrate during a cleaning operation wherein at least one of the application chemistries is an emulsion of a first immiscible liquid with a second immiscible liquid dispersed in the first immiscible liquid as droplets and solid particles distributed within the first immiscible liquid. The chemical delivery mechanism includes a plurality of inlet and outlet ports that are configured to deliver and remove appropriate application chemistries from the substrate surface. Sufficient amounts of appropriate application chemistries are applied to the surface of the substrate so that the application chemistries substantially interact with the contaminants effectively removing them. Thus, the plurality of application chemistries is used to enhance the cleaning operation resulting in a substantially clean substrate.

Other aspects and advantages of the invention will become more apparent from the following detailed description, taken in conjunction with the accompanying drawings, illustrating by way of example the present invention.

BRIEF DESCRIPTION OF THE DRAWINGS

The invention may best be understood by reference to the following description taken in conjunction with the accompanying drawings. These drawings should not be taken to limit the invention to the preferred embodiments, but are for explanation and understanding only.

DETAILED DESCRIPTION

Several embodiments for an improved and effective cleaning of a substrate surface will now be described. It will be obvious, however, to one skilled in the art, that the present invention may be practiced without some or all of these specific details. In other instances, well known process operations have not been described in detail in order not to unnecessarily obscure the present invention.

Figure 1:
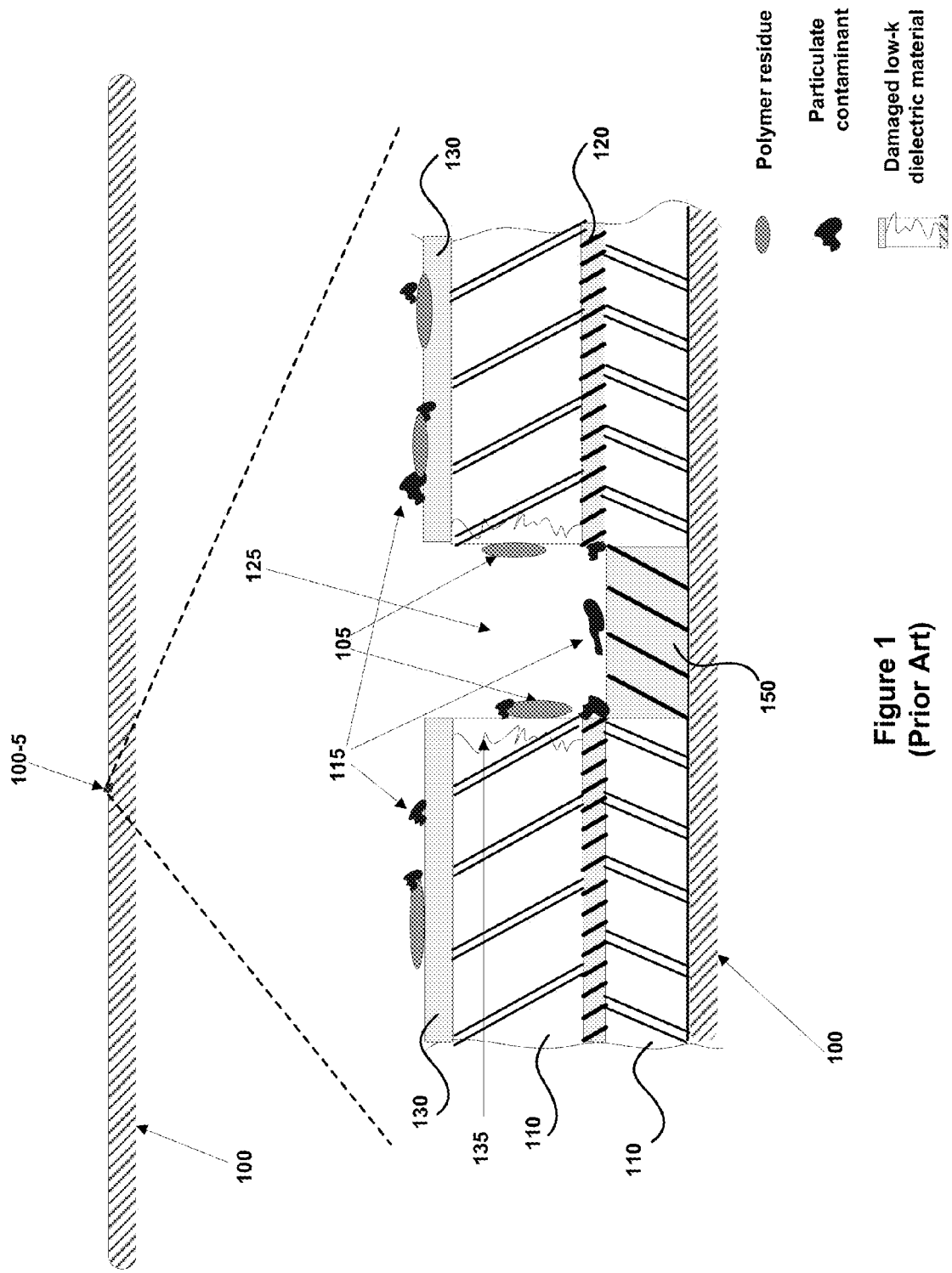
FIG. 1 is a schematic cross-sectional view of a substrate surface with various contaminants and damage to the low-k dielectric material, in accordance with one embodiment of the invention.

Conventional methods have mostly focused on providing solutions to remove a particular type of contaminant from the surface of the substrate. As is generally known in the industry, there is more than one type of contaminant that can cause damage to the surface of the substrate. FIG. 1 illustrates a simplified schematic diagram of a damaged portion 100-5 of a substrate 100 having a plurality of contaminants. As shown, the portion 100-5 of the substrate 100 includes a low-k dielectric film layer 110 formed on the substrate 100. The low-k dielectric film layer 110 is formed using any one of spin coating, dip coating, or by a chemical vapor deposition technique. The material used in forming the low-k dielectric film layer 110 can be one of SiCOH, porous SiCOH, Polyarlene ether, Porous polyarlene ether, porous Silicon Dioxide, etc. The low-k dielectric material is doped with carbon and a plurality of sub-micron pores are introduced into the low-k dielectric material to further lower the dielectric constant. Pores may be introduced using well-known techniques and is, therefore, not discussed in great detail in this application. The low-k dielectric film layer 110 maybe formed directly over a substrate surface, over previously fabricated layers such as etch stop layer 120 or in-between a plurality of fabricated layers such as between etch stop layer 120, hard mask layer 130 and/or photoresist layer 118, etc. The low-k dielectric film layer 110 provides insulation to one or more features 125 formed through the low-k dielectric film layer 110 or to the underlying structures such as copper interconnects 150 that connect down to transistors formed on the substrate 100. Isolating the features 125 formed on the substrate 100 using low-k dielectric film layer helps in reducing coupling capacitance between features 125 thereby reducing line delay. An etch stop layer 120 is formed on the low-k dielectric film layer 110 to allow for self-alignment of underlying contacts with the copper interconnects 150 and to maintain structural integrity of a feature 125 being formed. The feature 125 may be etched in the low-k dielectric film using a dual damascene process. A hard-mask layer or cap layer 130 is formed on top of the dielectric film layer adjacent to the etched feature 125 to protect the underlying features from any profile distortion.

In place of a hard-mask layer 130, a photoresist layer 118 may be formed on top of the low-k dielectric film layer 110.

During the stripping operations, the chemicals used in stripping the etch stop layer 120 and the hard mask layer/cap layer 130 cause polymer residues 105 to deposit in the vias and trenches formed during the dual damascene process. The polymer residues 105 adhere tightly to the surface of the substrate and hence are difficult to remove. Additionally, any left-over chemistry used in forming features may deposit on the substrate surface in particulate form 115. Due to the sufficiently small size of the particulates 115, they may easily find their way into hard-to-reach areas as particulate contaminant 115. It is, therefore, essential to remove these particulates contaminants 115 and polymer residues 105 so that the functionality of the features 125 and the characteristics of the low-k dielectric film layer 110 are preserved.

Moreover, due to compromised material properties of the low-k dielectric material 10, portions of the low-k dielectric film layer (material) 110, especially in an area around a feature, may get damaged during one or more fabrication operations. For example: Continued exposure to an etchant and post-etch chemistry, such as a stripping chemical, may result in damage to the low-k dielectric film layer 110 by depleting carbon from carbon doped low-k dielectric film layer 110 surrounding the etched feature 125. Due to depletion of carbon, the damaged low-k dielectric film layer 110 exhibits a higher dielectric constant than the dielectric constant of the ultra low-k dielectric material 110. Repairing or removing the damaged low-k dielectric film layer is, therefore, essential to reduce capacitive coupling and to further reduce power consumption.

Effective substrate cleaning to remove particulate 115 and polymer residue 105 contaminants and to preserve the low-k characteristics of the low-k dielectric material 110 is very important in order to maintain the quality and functionality of the resulting semiconductor products, e.g., microchips. In an embodiment of the invention, a plurality of process parameters related to the substrate surface is determined. These process parameters define characteristics associated with the substrate surface to be cleaned such as type and nature of material that form the substrate surface, type and nature of contaminants to be removed, type of various chemistries used in the fabrication operations, etc., so that appropriate application chemistries may be identified for cleaning the substrate. A plurality of application chemistries are selected and applied to the surface of the substrate in such a way as to substantially remove a variety of contaminants including particulate and polymer residue contaminants from the substrate surface. In addition to removing a variety of contaminants, some of the plurality of application chemistries are used to substantially remove or repair damaged low-k dielectric film layer to obtain a substantially clean substrate. The plurality of application chemistries may be applied sequentially or simultaneously by mixing them together so that more than one type of contaminant is effectively removed during the cleaning operation. Combining the application of various application chemistries greatly enhances the cleaning process resulting in a fairly clean substrate.

Figure 2A:
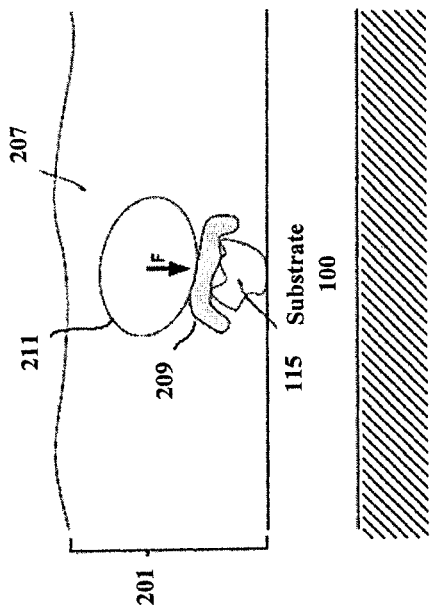
FIGS. 2A and 2B illustrate the functioning of the emulsion chemical in removing a particulate contaminant from the substrate surface, in accordance with one embodiment of the present invention.
Figure 2B:
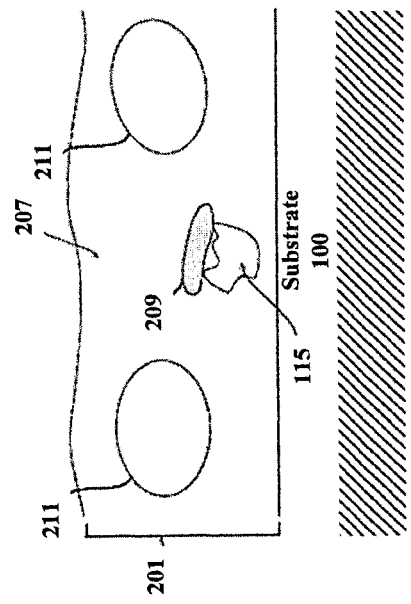
Figure 2:
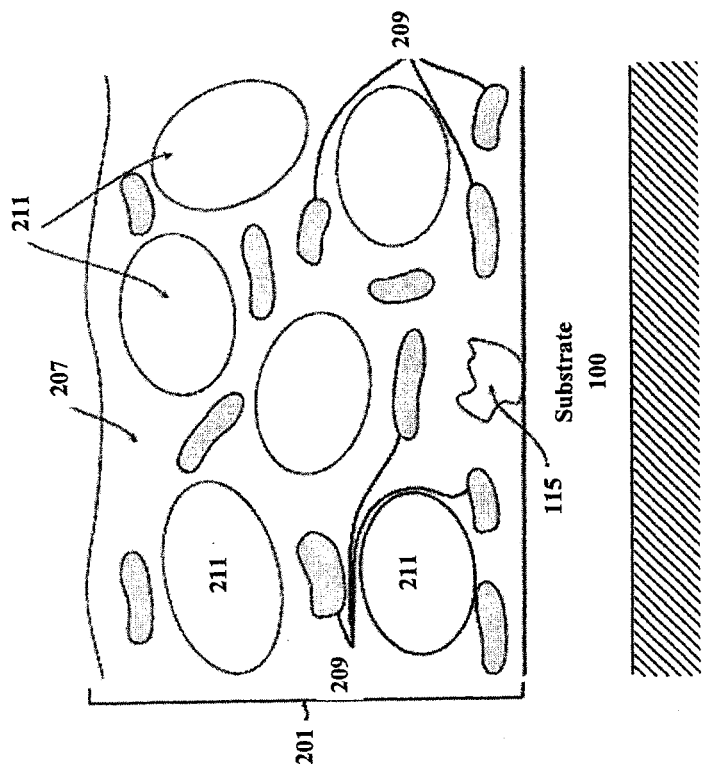
FIG. 2 illustrates a physical diagram of an emulsion chemical for removing particulate contaminants from a surface of a substrate, in accordance with one embodiment of the present invention.

In one embodiment, the plurality of application chemistries includes a first application chemistry as an emulsion of a first immiscible liquid with a second immiscible liquid dispersed within the first immiscible liquid in the form of droplets with a plurality of solid particles distributed through out the first immiscible liquid. FIGS. 2, 2A and 2B illustrate the composition and functioning of the first application chemistry in removing the particulate contaminants from the surface of the substrate. Referring to FIG. 2, the first application chemistry 201 includes a first immiscible liquid in the form of a continuous liquid medium 207, solid particles in the form of solid components 209, and a second immiscible liquid in the form of an immiscible component 211. The solid particles 209 and the immiscible component 211 are dispersed evenly within the continuous liquid medium 207. The immiscible components 211 are immiscible with respect to the continuous liquid medium 207.

The solid particles 209 within the first application chemistry 201 are chosen such that they do not adhere to the surface of substrate 100 when positioned in either close proximity to or in contact with the surface of the substrate 100; are capable of interacting with the particulate contaminant 115 material present on the substrate 100 surface when positioned in either close proximity or in contact with the particulate contaminant 115; avoid dissolution within the continuous liquid medium 207 of the first application chemistry 201; are capable of dispersing evenly throughout the continuous liquid medium 207 without forming lumps of solid particles 209; and have mechanical properties that do not cause damage to the substrate surface during the cleaning process. If the solid particles do not have the dispersing capability to evenly disperse within the continuous liquid medium 207, additional chemical dispersants may be added to the continuous liquid medium 207 to enable even dispersion of the solid particles 209.

FIGS. 2A and 2B illustrate the functioning of the solid particles 209 in the removal of particulate contaminant from the surface of the substrate. A downward force applied to the continuous liquid medium 207 of the first application chemistry enables the solid particles 209 to come within an interactive range of the particulate contaminant 115 on the surface of the substrate. The interactive range may be described as being in direct contact with the contaminant or close enough to interact with the contaminant. The downward force enables the solid particles 209 to interact with the particulate contaminant. The droplets of immiscible component may aid in the interaction between the solid particles 209 and particulate contaminant 115, as illustrated in FIG. 2A. The interaction is sufficient enough to overcome the adhesive forces that hold the particulate contaminant 115 to the surface of the substrate and release the particulate contaminant from the surface of the substrate 100. As the solid particles 209 move away from the surface of the substrate, the released particulate contaminant 115 moves along with the solid particle 209 away from the substrate surface substantially removing the particulate contaminant 115, as illustrated in FIG. 2B. It should be noted that the downward force exerted on the solid particles 209 is sufficient to also overcome any repulsive forces that may exist between the particulate contaminants 115 and the solid particles 209 so as to enable effective removal of the particulate contaminants 115. In one embodiment, the first immiscible liquid 207 is a polar solvent and the second immiscible liquid 211 is a non-polar solvent. In another embodiment, the first immiscible liquid 207 is a non-polar solvent and the second immiscible liquid 211 is a polar solvent. For additional information about the identification, composition and application of the first application chemistry to remove particulate contamination, reference can be made to U.S. patent application Ser. No. 11/347,154 filed on Feb. 3, 2006 and entitled "CLEANING COMPOUND AND METHOD AND SYSTEM FOR USING THE CLEANING COMPOUND" assigned to Lam Research Corporation, the assignee of the subject application, which is incorporated herein by reference.

The plurality of application chemistries further includes a second application chemistry that is applied to the surface of the substrate to substantially remove any polymer residues that are present. The chemicals that can help remove polymer residue include organic solvents, which can penetrate and swell the polymer residue. The solid particle 209 can then interact with the swollen polymer residue and overcome the adhesion force between the residue and the surface to remove the residue. Common organic solvents for this purpose include isopropyl alcohol, acetone, butyl acetate, ethylene glycol, methanol, N-methylpyrrolidone (NMP), propylene glycol monomethyl ether acetate, dimethylformamide, dimethylacetate, dimethyl sulfoxide, cyclohexylpyrrolidone (CHP), etc.

In one embodiment, the second application chemistry is mixed with the first application chemistry and the combined mixture is applied to the surface of the substrate simultaneously so that both the particulate and polymer residue contaminants are substantially removed from the surface of the substrate at the same time. In this embodiment, a wet cleaning chemistry of the second application chemistry is mixed with the continuous liquid medium of the first application chemistry in which a second immiscible liquid and solid particles are dispersed, and the mixture is applied to the surface of the substrate to substantially remove the particulate contaminants and residual polymer residue contaminants.

In addition to the first and second application chemistry, the plurality of application chemistries includes a third application chemistry to selectively remove damaged low-k dielectric film layer from the surface of the substrate during a cleaning operation. The third application chemistry is identified based on process parameters associated with the surface of the substrate 100 which includes characteristic aspects of the damaged low-k dielectric film layer 135 adjacent to the feature 125. The process parameters may additionally include characteristic aspects of one or more film layers, such as etch stop layer, hard mask layer, photoresist layer, etc., formed over and/or under the damaged low-k dielectric film layer that may also have to be removed to retain the profile of the feature 125. The characterizing aspects of the damaged low-k dielectric film layer 135 and the associated film layers may include type of film layer, composition of the film layer, thickness of the damaged material, thickness of the associated film layers to be removed, temperature of the film layer in the area where the feature is formed, etc. These process parameters may change from one substrate to the next. The identified third application chemistry is applied in a controlled fashion so as to optimally expose the damaged low-k dielectric film layer 135 to the third application chemistry substantially removing them from the surface of the substrate 100 while retaining the low-k dielectric characteristic of the remaining low-k dielectric material 110.

Figure 3A:
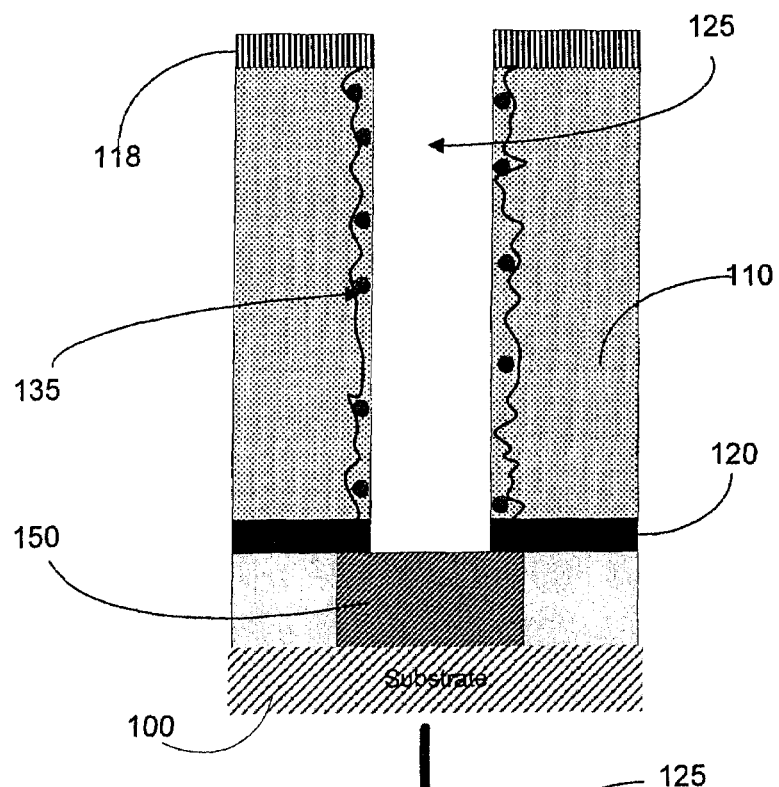
FIG. 3A illustrates a cross-sectional view of a damaged low-k dielectric film layer and FIG. 3B illustrates a cross sectional view of the substrate after the removal of the damaged low-k dielectric film layer from the surface of the substrate, in one embodiment of the invention.
Figure 3B:
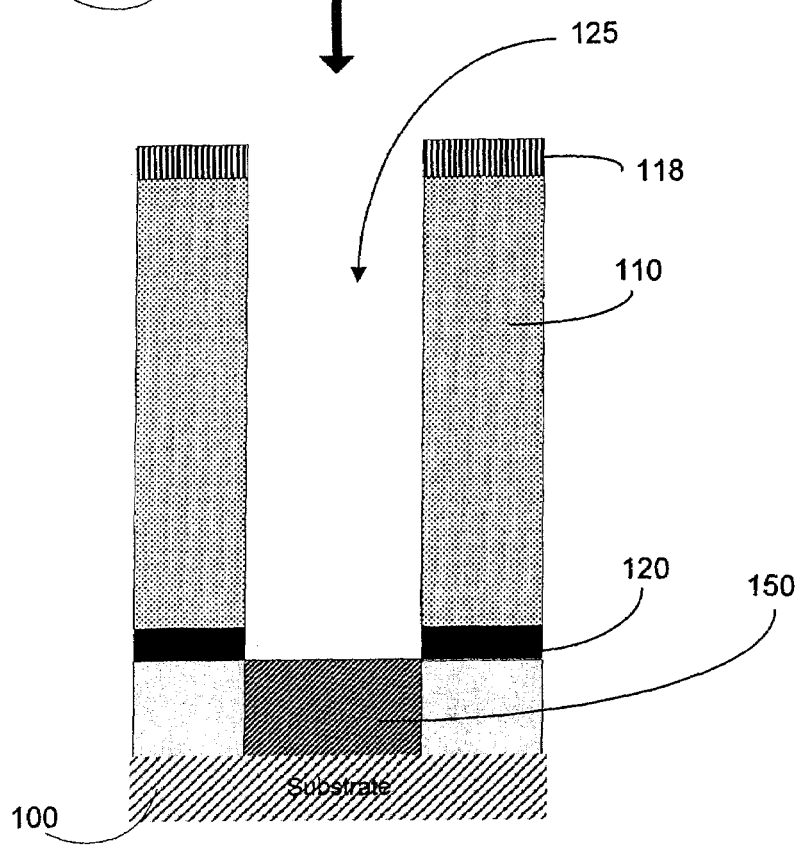

FIGS. 3A and 3B illustrate a schematic cross-sectional view of an area in which a feature is formed on the surface of the substrate before and after removal of damaged low-k dielectric film layer. As shown in FIG. 3A, a feature 125 is formed through a low-k dielectric material 110, through additional film layers such as an etch stop layer 120, a photoresist layer 118 and over a metal layer, such as a copper interconnect layer 150 formed on the surface of the substrate 100. During the etching of the feature and subsequent cleaning of the etchant, the area around the feature is damaged. The damaged low-k dielectric film layer 135 around the feature may be due to depletion of carbon due to extended exposure to the stripping chemical or other fabrication chemicals. The controlled application of the third application chemistry selectively removes the damaged low-k dielectric film layer around the feature so that the functionality of the feature is maintained. The controlled application of the third application chemistry also removes portions of other film layers formed over or under the damaged low-k dielectric film layer so that profile of the feature is maintained, as illustrated in FIG. 3B. For additional information about the identification and application of the third application chemistry to remove damaged low-k dielectric film layer, reference can be made to U.S. patent application Ser. No. 11/644,779 filed on Dec. 21, 2006 and entitled "METHOD OF DAMAGED LOW-K DIELECTRIC FILM LAYER REMOVAL" assigned to Lam Research Corporation, the assignee of the subject application, which is incorporated herein by reference.

The third application chemistry is applied to the surface of the substrate along with the first and second application chemistries so that the contaminant removal process is enhanced. In one embodiment, the third application chemistry is applied simultaneously by combining with the first application chemistry to effectively remove the damaged low-k dielectric film layer along with the particulate contaminants. In this embodiment, the third application chemistry is combined with the continuous liquid medium of the first application chemistry and the mixture is applied to the surface of the substrate so that the damaged low-k dielectric film layer is selectively removed during the particulate removal process. The application of the second application chemistry may either follow or precede the application of the mixture of the first and third application chemistries.

In another embodiment, the third application chemistry is applied simultaneously by combining with the second application chemistry and applied to the surface of the substrate. In this embodiment, the third application chemistry is mixed with the wet cleaning chemistry of the second application chemistry and the combined chemistry is applied to the surface of the substrate. The first application chemistry may be applied to the surface of the substrate either before or after the application of the combined second and third application chemistries.

In another embodiment, the third application chemistry is applied sequentially after the application of the first and second application chemistry so that the damaged low-k dielectric film layer is selectively removed along with the particulate and polymer residue contaminant. In yet another embodiment, the third application chemistry is combined with the mixture of the first application chemistry and the second application chemistry. The combined mixture is applied to the surface of the substrate to enhance the cleaning operation. In this embodiment, the third application chemistry is mixed with the mixture of continuous liquid medium of the first application chemistry and the wet cleaning chemistry of the second application chemistry is mixed. The combined mixture is applied to the surface of the substrate to effectively remove the contaminants and the damaged low-k dielectric film layer.

With the current trend of reduced feature size and increased density, removing the damaged low-k dielectric film material from an area around the feature proves quite challenging. There is a high likelihood that the current methods to remove the damaged material may potentially damage the existing features adjacent to the damaged low-k dielectric film layer or may cause additional damage to the low-k dielectric material 110. It is, therefore, desirable to find alternate ways to restore the low-k characteristics of the damaged low-k dielectric film layer so that the functionality of the features is preserved. To this order, a fourth application chemistry to selectively repair the damaged low-k dielectric film layer 135 is included in the plurality of application chemistries to restore the low-k characteristics of the damaged low-k dielectric film layer 135 so that the repaired low-k dielectric film layer exhibits significantly equivalent characteristics of the low-k dielectric material 110. The fourth application chemistry includes gas chemistry with a hydrocarbon group. The carbon in the hydrocarbon group of the gas chemistry is induced into the carbon depleted low-k dielectric film layer on the substrate by controlled application so that the damaged low-k dielectric film layer is sufficiently exposed to the gas chemistry substantially repairing the damaged low-k dielectric film layer. For additional information about the identification and application of fourth application chemistry to repair the damaged low-k dielectric film layer, reference can be made to U.S. patent application Ser. No. 11/708,916 filed on Feb. 20, 2007 and entitled "METHOD OF LOW-K DIELECTRIC FILM REPAIR" assigned to Lam Research Corporation, the assignee of the subject application, which is incorporated herein by reference.

In one embodiment, the fourth application chemistry is integrated with the first and second application chemistry to enhance the cleaning operation by substantially removing the particulate and polymer residue contaminants while substantially repairing the damaged low-k dielectric film layer around the features. By careful treatment of the surface of the substrate with a mixture of application chemistries including the fourth application chemistry the functionality of the features and the characteristics of the low-k dielectric material are preserved.

In one embodiment of the invention, the first, second and fourth application chemistry are applied to the surface of the substrate sequentially. The order of the application of the first, second and fourth chemistry is not important as long as the three application chemistries are applied to enable substantial removal of the contaminants while the damaged low-k dielectric film layer is substantially repaired. In another embodiment, the fourth application chemistry is mixed with the first and second application chemistries and the combined mixture is applied to the surface of the substrate simultaneously so as to provide an optimally clean substrate.

In addition to the application chemistries listed above, a fifth application chemistry in the form of a metal passivation chemistry, such as benzotriazole (BTA), is included in the plurality of application chemistries to inhibit oxidation of metal layers formed on the substrate. The copper metal layers are formed during fabrication operations to provide interconnectivity to the underlying features, such as transistors. However, after metal deposition, the copper surface is exposed to the ambient environment in the fabrication process that may cause corrosion of the copper surface. The corrosion may result in unreliable connectivity to the underlying devices and hence to an inoperable IC device. The problem of corrosion may be reduced by applying metal passivation chemicals or corrosion inhibitors such as BTA, to the exposed copper surface. The metal passivation chemical may be added to any one of the plurality of application chemistries so as to prevent the metal film from being oxidized during the wet cleaning process.

In one embodiment of the invention, the metal passivation chemical may be combined with any one of the first, second, third or fourth application chemistry and applied to the surface of the substrate during the cleaning operation so as to protect the exposed copper metal layer. By applying the metal passivation chemical to the surface of the substrate during the cleaning process, damage and/or etch of the exposed metal film is minimized while preventing oxidizing of the metal film after the wet treatment process.

The plurality of application chemistries are not limited to the above referenced application chemistries but can be extended to include other application chemistries that may be used to further clean the surface of the substrate off any impurities and/or damage so that the resulting surface are substantially clean and the devices thereon are fully functional. The aforementioned application chemistries are applied after a post-etch operation to substantially clean the contaminants and repair/remove the damaged low-k dielectric materials sequentially or simultaneously. The plurality of application chemistries, their composition and application conditions that have shown promising results are shown in the following tables.

TABLE A

Classification and description of chemicals used in treating dielectric surface

| Description of Chemical | Chemical Composition |
|---|---|
| A1. Particle removal formulation | 0.1%-10% by weight stearic acid + 0.25-10% by weight ammonium hydroxide |
| A2. Oxidant | Hydrogen Peroxide, Ozone, Nitric acid, etc. |
| A3. Organic solvent | Common organic solvent used in semiconductor industry such as isopropyl alcohol, acetone, butyl acetate, ethylene glycol, methanol, N-methyl pyrrolidone (NMP) propylene glycol monomethyl ether acetate, Dimethyl formamide (DMF), Dimethyl Sulfoxide (DMSO), Dimethylacetamide (DMAC), ethyl lactate, cyclohexylpyrrolidone (CHP), hydroxyethylpyrrolidone (HEP), aminoethyoxyethanol (AEE), monoethanolamine (MEOA), triethanolamine (TEOA), Isopropanolamine (MIPOA), N-methyl ethanolamine (NMEA), Ethylene glycol monoethyl ether, diethylene glycol monobutyl ether, sulfolane, etc., and their mixture thereof |
| A4. Acid | Nitric acid ($HNO_3$), Sulfuric acid ($H_2SO_4$), Hydrochloric acid (HCl), acetic acid, oxalic acid, citric acid, gluconic acid, lactic acid, etc. |
| A5. Base | Ammonia ($NH_3$), Tetramethyl Ammonium Hydroxide (TMAH) |
| A6. Mild etchant | Hydrogen fluoride (HF), Ammonium Fluoride (NH4F), a mixture of HF and NH4F, TMAH and other quaternary ammonium hydroxide |

TABLE B

Application chemistries used for post-etch polymer contaminant removal:

| Polymer to be removed | Polymer composition | Chemical to be used and example | Condition to be used[7] |
|---|---|---|---|
| Post PR strip for FEOL | Photoresist such as i-line, g-line, 248 nm PR, 193 nm PR | Particle removal formulation – (A1 from Table A) + oxidant – (A2 from Table A) + organic solvent - (A3 from Table A) + acid – (A4 from Table A) or base - (A5 from Table A) Example: Particle removal formulation + 5-10% w $H_2O_2$ + 1-10% w diethylene glycol monobutyl ether + 5-10% w $NH_3$ | 20° to 70° C., for 1 s to 2 minutes with optimum condition of 5 sec |
| Post high density ion implantation PR strip | Photoresist such as i-line, g-line, 248 nm PR, 193 nm PR; carbonized photoresist and cross-linked photoresist | | |
| Post etch polymer for BEOL without metal hard mask, sidewall polymer | $CxFy$, Si, O | Particle removal formulation (A1 from Table A) + organic solvent (A3 from Table A) + mild etchant for silicon oxide - (A6 from Table A) Example: Particle removal formulation + 1-10% w NMP + 0.1-10% w $NH_4F$ | 20° to 70° C., for 1 s to 2 minutes with optimum condition of 5 sec |
| Post etch polymer for BEOL without metal hard mask on copper surface | $CxFy$, Si, O, Cu | Particle removal formulation (A1 from Table A) + acid (A4 from Table A) Example: Particle removal formulation + 0.05-5% HF | 20° to 70° C., for 1 s to 2 minutes with optimum condition of 5 sec |
| Post etch polymer for BEOL with metal hard mask | $CxFy$, Si, O, Ti, Cu, Ta, etc | Particle removal formulation (A1 from Table A) + organic solvent (A3 from Table A) + mild etchant for silicon oxide (A6 from Table A) + H2O2 (A2 from Table A) Example: Particle removal formulation + 1-10% w diethylene glycol monobutyl ether + 0.1-10% w NH4F + point of use mixture of 1-10% w $H_2O_2$ | 20° to 70° C., for 1 s to 2 minutes with optimum condition of 5 sec |

TABLE C

Application chemistries used for metal passivation

| Metals to be passivated | Chemicals to passivate | Conditions |
|---|---|---|
| Al | H2O2 to form a dense oxide layer; phosphate reactant such as orthophosphoric acid, as referenced in U.S. Pat. No. 6525404 | 0.01-2% w in weight Example: Particle removal formulation + 0.01-2% w orthophosphoric acid |
| Cu | Glycine; carboxylic acid such as acetic acid, citric acid, oxalic acid, gluconic acid, lactic acid, EDTA, etc as referenced in U.S. Pat. No. 6967169; benzotriazole (BTA); tolytriazole as referenced in U.S. Pat. No. 4657785; thiazole derivatives such as 5-benzylidene-2,4-dioxotetrahydro-1,3,-thiazole (BDT), 5-(4'-isopropylbenzylidene)-2,4-dioxotetrahydro-1,3-thiazole (IPBDT), 5-(3'-thenylidene)-2,4-dioxotetrahydro-1,3-thiazole (TDT), 5-(3',4'-dimetoxybenzylidene)-2,4-dioxotetrahydro-1,3-thiazole (MBDT), etc; thiols such as 3-amino-1,2,4-triazole-5-thiol (ATT), 2-mercaptoethanol, 2-mercaptoindole, etc as referenced in U.S. Pat. No. 6200947; compounds containing a heterocyclic atoms such as nitrogen, sulfur and oxygen. Organic amine such as choline | 0.01-2% w in weight and may require organic co-solvent Example: Particle removal formulation + 0.0 -2% w BTA |
| W | Ethylene glycol as referenced in U.S. Pat. No. 5893756; phosphates, polyphosphates and silicates, with potassium hypophosphite and potassium silicate as examples, see U.S. Pat. No. 6206756 and PCT/US1999/027033; organic compound | 0.01-2% w in weight Example: Particle removal formulation + 0.01-2% w pyridazine |

TABLE C-continued

Application chemistries used for metal passivation

| Metals to be passivated | Chemicals to passivate | Conditions |
|---|---|---|
| | having at least one mercapto group, an organic compound having at least two hydroxyl groups, and an organic compound having at least one hydroxyl group and at least one carboxyl group as referenced in U.S. Pat. No. 6472357 and 6482750; glycine, pyridazine, as referenced in U.S. Pat. No. 6136711 | |

Application Chemistries Used for Damaged Low-k Removal:

Diluted Hydrofluoric acid, Phosphoric acid or Sulfuric acid diluted to about 1 part of acid to 100 parts of de-ionized water, or other fluoride containing salts such as ammonium fluoride, as described in U.S. application Ser. No. 11/644,779, which is incorporated herein by reference.

Application Chemistries Used for Damaged Low-k Dielectric Film Repair:

Application chemistry having methyl containing hydrocarbons such as Hexamethyldisilazane (HMDS), Trimethyldisilazane (TMDS), Chlorosilanes such as Trimethylchlorosilane (TMCS), Dimethyldichlorosilane (DMDCS), Trimethylchlorosilane (($CH_3$)$_3$Si—Cl), n-Polytrimethylsilane (n-PTMS), combinations of these hydrocarbon chemicals, or combinations of these chemicals mixed with other chemicals, as described in U.S. patent application Ser. No. 11/708,916, which is incorporated herein by reference.

It is to be noted that the above mentioned exemplary application chemistry compositions can be applied to the surface of the substrate from about room temperature to about 70° C. for about 1 second to about 2 minutes with an optimal condition of about 5 seconds to efficiently remove polymer residues along with particle contaminants. Further, it is to be noted that the preferred conditions for applying metal passivation chemicals to passivate various metals is about 40° C. with an exposure time of about less than 10 seconds.

In order to identify the appropriate application chemistries, the surface of the substrate is analyzed and a plurality of process parameters is determined. The process parameters define the characteristic aspects associated with the surface of the substrate such as characteristics of damaged low-k dielectric film layer, characteristics of features formed, characteristics of additional film layers formed over or under the low-k dielectric film layer through which features were etched, characteristics of contaminants formed on the substrate, etc. The characterizing aspects of the damaged low-k dielectric film layer and the associated film layers may include type of film layer, composition of the film layer, thickness of the damaged material, thickness of the associated film layers to be removed, temperature of the film layer in the area where the feature is formed. The characterizing aspects of the features may include type of feature formed, aspect ratio of the feature, type of etching chemical used in forming the feature, concentration of the etching chemical, temperature of the etching chemical, pressure of the etching chemical, etc. The characterizing aspects of the contaminants may include type of contaminant, composition of the contaminant, type of layer formed on the substrate, surface temperature of the substrate, etc. These process parameters may change from one substrate to the next.

There are numerous benefits to combining and applying the plurality of application chemistries. Some of the benefits of this in-situ application process include enhanced contaminant removal process wherein more than one contaminant is effectively removed, minimum contamination due to minimal exposure of substrate to ambient environment during cleaning operation, minimum aging of low-k dielectric film layer, minimum process time and substantial cost reduction.

Figure 4:
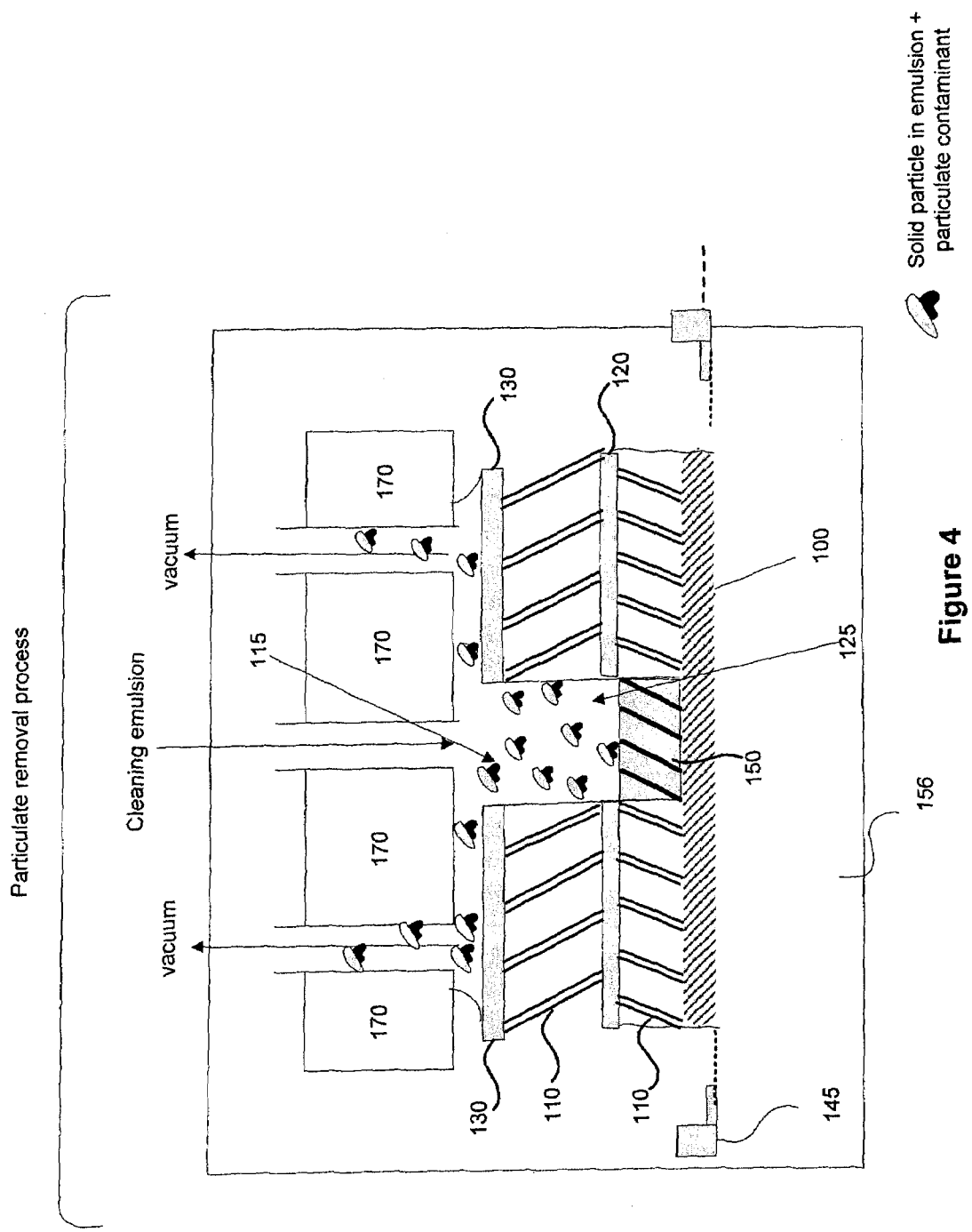
FIG. 4 illustrates a schematic cross-sectional view of an applicator used in removing particulate contaminants from the surface of the substrate, according to one embodiment of the invention.

With the above detailed description of the application chemistries that includes composition and function, a system to introduce the application chemistries will now be described. A chemical delivery mechanism system (system) to introduce a plurality of application chemistries to the surface of substrate during a cleaning process includes a plurality of applicators to introduce appropriate application chemistry to the surface of the substrate 100. FIG. 4 illustrates one such applicator, a first application chemistry applicator, for introducing a first application chemistry to the surface of the substrate. In this embodiment, the first application chemistry applicator is a proximity head 170. The substrate is received and supported using a substrate supporting device 145. The proximity head 170 includes a plurality of inlet and outlet ports to deliver and remove appropriate application chemistries. The proximity head 170 is disposed within a housing chamber 156 and the first application chemistry is applied as a liquid meniscus. The term, "meniscus," as used herein with reference to application chemistry, refers to a volume of application chemistry bounded and contained in part by surface tension of the application chemistry between the opposing surface of a proximity head and a surface of the substrate 100. The meniscus, thus formed, is also controllable and can be moved over a surface in the contained shape and is used to remove the particulate contaminants from the surface of the substrate 100. In specific embodiments, the meniscus shape can be controlled by precision first application chemistry delivery and removal systems that may further include a computing system.

As described herein, a proximity head is a substrate treatment apparatus that can deliver precise volume of an appropriate chemistry to a surface of a substrate 100 to be treated, and remove the chemistry from the surface, when the proximity head is placed in close relation to the surface of the substrate 100. In one example, the proximity head has an opposing head surface (opposing surface) and the opposing surface is placed substantially parallel to the surface of the substrate 100. A meniscus is formed between the opposing surface and the surface of the substrate 100. In addition to the first application chemistry, the proximity head may also be configured to deliver a plurality of application chemistry and is equipped with vacuum ports for removing the plurality of application chemistries that were delivered.

By controlling the delivery and removal of the chemistry to the meniscus, the meniscus can be controlled and moved over the surface of the substrate 100. In some embodiments, the substrate 100 can be moved, while the proximity head 170 is still, and in other embodiments, the proximity head moves and the substrate 100 remains still, during the processing period. Further, for completeness, it should be understood that the processing can occur in any orientation, and as such, the meniscus can be applied to surfaces that are not horizontal (e.g., vertical substrates or substrates that are held at an angle).

For more information with respect to the proximity head, the formation of a meniscus and the application of the meniscus to the surface of a substrate, reference may be made to: (1) U.S. Pat. No. 6,616,772, issued on Sep. 9, 2003 and entitled "METHODS FOR WAFER PROXIMITY CLEANING AND DRYING,"; (2) U.S. patent application Ser. No. 10/330,843, filed on Dec. 24, 2002 and entitled "MENISCUS, VACUUM, IPA VAPOR, DRYING MANIFOLD," (3) U.S. Pat. No. 6,988,327, issued on Jan. 24, 2005 and entitled "METHODS AND SYSTEMS FOR PROCESSING A SUBSTRATE USING A DYNAMIC LIQUID MENISCUS," (4) U.S. Pat. No. 6,988,326, issued on Jan. 24, 2005 and entitled "PHOBIC BARRIER MENISCUS SEPARATION AND CONTAINMENT," and (5) U.S. Pat. No. 6,488,040, issued on Dec. 3, 2002 and entitled "CAPILLARY PROXIMITY HEADS FOR SINGLE WAFER CLEANING AND DRYING," each is assigned to Lam Research Corporation, the assignee of the subject application, and each is incorporated herein by reference. For additional information about top and bottom menisci, reference can be made to the exemplary meniscus, as disclosed in U.S. patent application Ser. No. 10/330,843, filed on Dec. 24, 2002 and entitled "MENISCUS, VACUUM, IPA VAPOR, DRYING MANIFOLD." This U.S. patent application, which is assigned to Lam Research Corporation, the assignee of the subject application, is incorporated herein by reference.

The proximity head 170 includes controls to control the flow of the first application chemistry into the housing chamber 156 such that the solid particles dispersed in the continuous liquid medium interact with the particulate contaminant substantially removing them. The proximity head 170 includes a reservoir operatively connected to an inlet port to supply adequate quantity of first application chemistry and a vacuum port that is operatively connected to an outlet port to remove the application chemistry and the particulate contaminant released in the housing chamber 156 during the cleaning operation so that fresh first application chemistry may be introduced for a more effective cleaning. One skilled in the art will appreciate that the substrate 100 may rotate and move linearly. Alternatively, the proximity head may move over substrate 100 while the substrate 100 is stationary or also moving. For more information on the application of the first application chemistry reference can be made to U.S. patent application Ser. No. 11/347,154 assigned to the assignee of the subject application, which is incorporated herein by reference.

The system also includes a second applicator to introduce second application chemistry. The second application chemistry is selected to remove polymer residue contaminants based on a plurality of process parameters obtained by analyzing the surface of the substrate. The second applicator includes a wet cleaning applicator to introduce a wet cleaning chemistry to the substrate surface. In one embodiment of the invention, the wet cleaning applicator to introduce a wet cleaning chemistry to the surface of the substrate 100 is a proximity head 170 similar to the one used in applying the first application chemistry. The second applicator may be housed in a separate housing chamber or may be housed in the same housing chamber as the first applicator. For additional information on the identification and application of the second application chemistry to remove polymer residues, reference may be made to U.S. patent application Ser. No. 11/827,479, assigned to the assignee of the subject application, which is incorporated herein by reference.

The system further includes a third application chemistry applicator to introduce a third application chemistry to substantially remove damaged low-k dielectric film around a feature without damaging the adjacent features. In one embodiment, the third application chemistry applicator is a proximity head 170 similar to the one used in applying the first application chemistry. The third applicator may be housed in a separate housing chamber or may be housed in the same housing chamber as the first and/or the second applicator. The third application chemistry may be applied in a controlled fashion using controls available at the third application chemistry applicator so that the surface is substantially exposed to the third application chemistry enabling selective removal of the damaged low-k dielectric film layer. For additional information about the third application chemistry used to remove the damaged low-k dielectric film layer, reference can be made to U.S. patent application Ser. No. 11/644,779 filed on Dec. 21, 2006, entitled "METHOD OF DAMAGED LOW-K DIELECTRIC FILM LAYER REMOVAL", assigned to the assignee of the subject application, which is incorporated herein by reference.

In an exemplary embodiment, the third application chemistry applicator may be integrated with the first application chemistry applicator and/or the second application chemistry applicator. In this embodiment, the third application chemistry may be introduced using the proximity heads associated with the first and/or second application chemistry applicator. In another embodiment, a single proximity head may be used to introduce first, second and third application chemistries by mixing the first, wet chemistry of the second and third application chemistries together and applying the combined mixture to the surface of the substrate so that the contaminants and the damaged low-k dielectric material are substantially removed without damaging the surface of the substrate.

In an alternate embodiment, the plurality of inlet and outlet ports of the proximity head is used to introduce and remove individual application chemistries. In this embodiment, each of the application chemistries are introduced separately (during a sequential application process) through the respective inlet port and removed through corresponding outlet ports.

Figure 5:
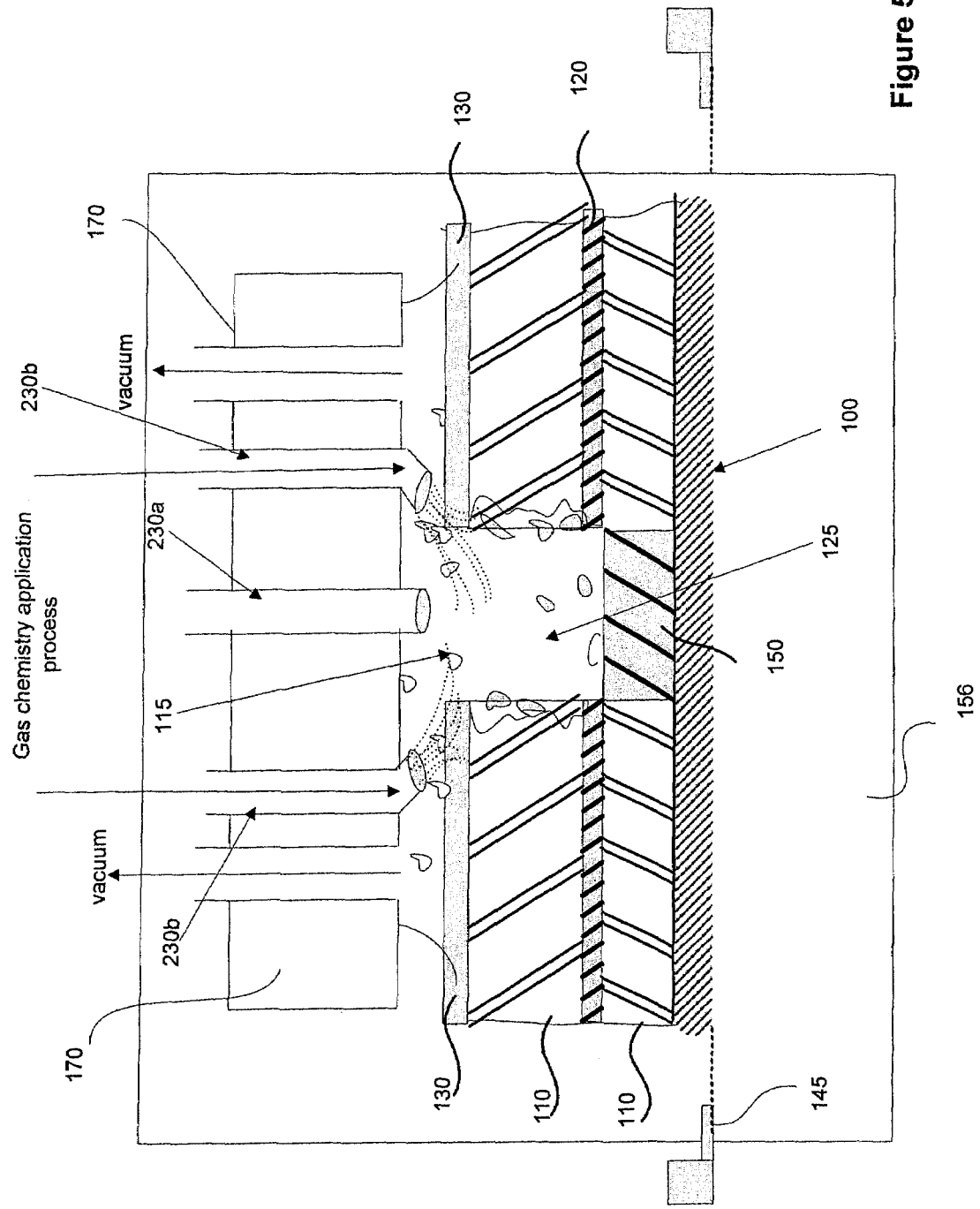
FIG. 5 illustrates an alternate embodiment of an applicator illustrated in FIG. 4 used in repairing damaged low-k dielectric film, in one embodiment of the invention.

The system may further include a fourth application chemistry applicator to introduce a fourth application chemistry to substantially repair the damaged low-k dielectric material. The fourth application chemistry is a gaseous chemistry having hydrocarbon groups chosen based on process parameters obtained by analyzing the damaged low-k dielectric film layer. In one embodiment of the invention, the fourth application chemistry applicator is a proximity head 170 configured to deliver a gas chemistry meniscus to the surface of the substrate, as illustrated in FIG. 5. The gas chemistry meniscus is substantially gas, but may include liquid in a moisture state. Due to the free-flowing nature of the gas chemistry, the applied gas chemistry may not be completely contained within a containment region. However, a more localized application of highly concentrated gas is made possible through one or more nozzles 230a, 230b.

The exposure of the gas chemistry meniscus is isotropic in nature which enables uniform application of the gas chemistry meniscus to a portion of the surface of the substrate 100 so that the carbon depleted low-k material exposed to the gas chemistry meniscus is substantially repaired. A plurality of nozzles 230a, 230b in the proximity head 170 are positioned such that the gas chemistry meniscus is applied at an angle that is substantially perpendicular or between perpendicular and parallel to the surface of the substrate 100. The gas chemistry meniscus is applied such that the flow is substantially parallel to the surface of the substrate 100 and provides an impact on the damaged low-k material 135. The angling of the nozzles allow the gas chemistry meniscus 210 to be applied and contained within a portion of the substrate 100 relative to the flow or movement of the substrate 100.

Figure 6:
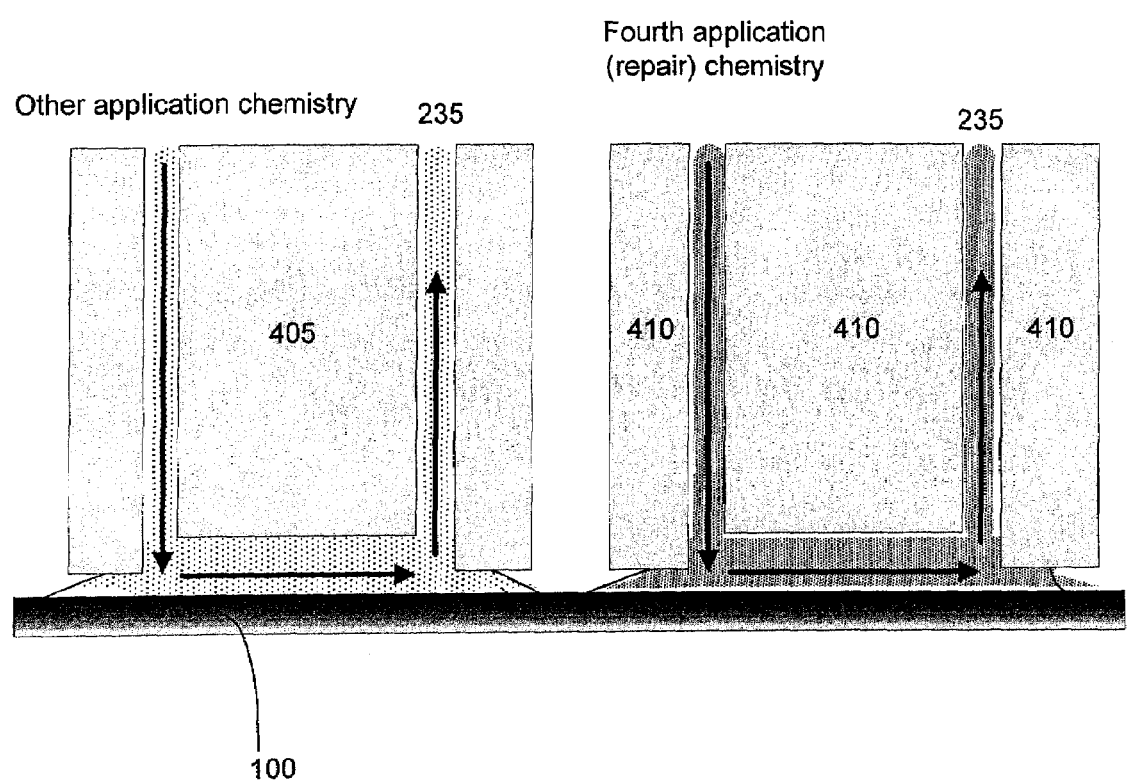
FIG. 6 illustrates an alternate embodiment of an applicator depicted in FIGS. 4 and 5 used in repairing damaged low-k dielectric film, in an embodiment of the invention.

In addition to the use of nozzles, the dual proximity heads may be configured to provide a highly focused gas chemistry application. In one embodiment of the invention illustrated in FIG. 6, the proximity heads are extended such that they form a pocket into which the gas chemistry is applied as shown. The extensions of the proximity head surfaces provide a partial wall that substantially prevents the gas chemistry from escaping out so that a more focused gas chemistry can be applied to the surface of the substrate for effective cleaning. As is evident in FIG. 6, additional application chemistries may be applied to the substrate surface in conjunction with the application of the fourth application chemistry.

For additional information with respect to the angling of the nozzles, proximity head configuration and application of the fourth application chemistry to substantially repair the damaged low-k dielectric film layer, reference can be made to an U.S. patent application Ser. No. 11/708,916, filed on Feb. 20, 2007, entitled "METHOD OF LOW-K DIELECTRIC FILM REPAIR", assigned to the assignee of the subject application, which is incorporated herein by reference.

The embodiments of the invention are not restricted to using different applicators for applying different application chemistry. Additionally, the housing chamber 156 is not restricted to include a single applicator for applying a single application chemistry as depicted in FIG. 4. In alternate embodiments, the housing chamber 156 may include a plurality of applicators with each applicator introducing a different application chemistry to substantially clean the substrate. In this embodiment, the plurality of inlet ports may be used to introduce appropriate application chemistries.

Figure 7:
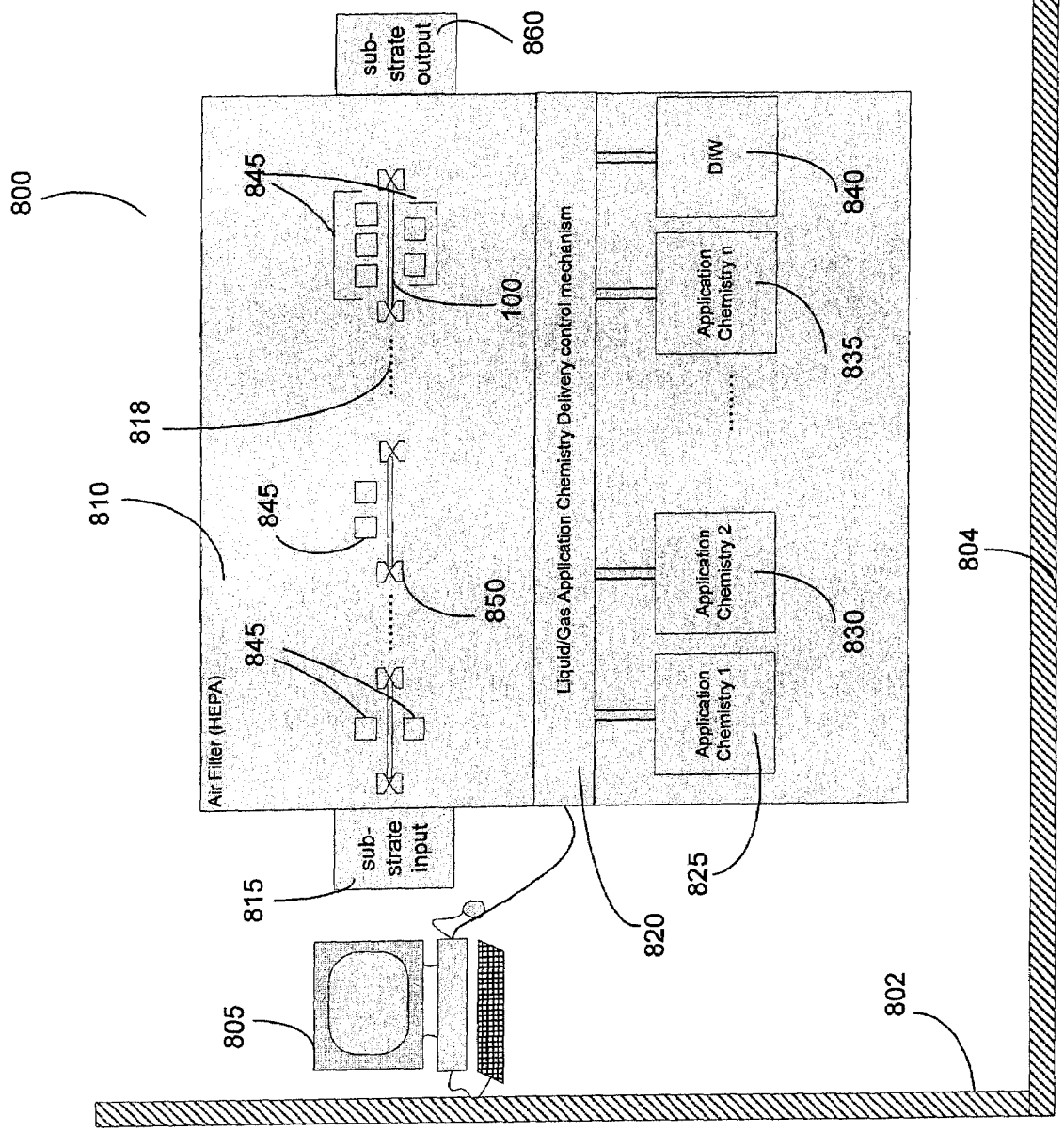
FIG. 7 illustrates a schematic cross-sectional view of a cleaning chamber with a plurality of applicators used in cleaning a surface of a substrate, according to one embodiment of the invention.

An exemplary system used to apply a plurality of application chemistries is illustrated in FIG. 7, in one embodiment of the invention. As depicted, the system includes a plurality of applicators brought together in an ambient controlled clean room with a wall 802 and floor 804 of which are shown. The system in the clean room (system) 800 includes a housing chamber 810, within which a plurality of proximity heads 845 are located. The proximity heads 845 shown within the housing chamber 810 may include dual proximity heads 845 positioned on either side of a processing region 818 through which a substrate 100 moves in the housing chamber 810. Variations of the number and position of proximity heads can be employed. FIG. 7 shows some of the variations, such as dual proximity heads and 5 proximity heads, located on either side of the processing region 818, through which the substrate 100 with carbon depleted low-k material 135 is transported. The proximity heads to introduce some of the gaseous application chemistries may be located within the same housing chamber 810 or may be located in a separate housing chamber within the clean room 800.

The substrate 100 is introduced into the housing chamber 810 through a substrate input region 815 and is removed from a substrate output region 860. A carrier 850 positioned in the processing region 818 aids in receiving the substrate at the substrate input region 815, transporting the substrate 100 across the system 800 through the proximity heads 845 and delivering the substrate at the substrate output region 860. In addition to the carrier, the system may also include a chuck to receive, hold, transport and spin the substrate around an axis of rotation. The system 800 also includes a set of reservoirs 825, 830, 835, etc. to contain a plurality of application chemistries that are used in removing contaminants and either removing or repairing the damaged low-k material 135. The system can be employed to apply a variation of application chemistry including gas chemistry and other cleaning chemistries and De-ionized water (DIW) using a combination of proximity heads.

The application chemistries are applied to the surface of the substrate 100 in a controlled manner, based on process parameters obtained by analyzing the substrate surface, using a liquid/gas application chemistry delivery control mechanism (delivery control mechanism) 820. The delivery control mechanism 820 supplies the appropriate application chemistries from the appropriate reservoirs through appropriate applicators. A computer 805 running a software may be communicatively connected to the delivery control mechanism 820 to adjust the controls within the delivery control mechanism 820 so that the application chemistries may be applied to the substrate 100 in a controlled manner. Although the computer 805 is shown to be located within the clean room, the computer 805 can be positioned anywhere outside the clean room and communicatively connected to the delivery control mechanism 820 within the housing chamber 810.

A plurality of input parameters associated with the application chemistries is used to manipulate the delivery controls based on the process parameters of the substrate surface. Some of the input parameters of the application chemistries that may be manipulated include quantity of flow, concentration of the application chemistry, temperature, pressure, application start time and duration of application. The computer 805 may be any standard computing device with an input module to receive the input parameters and display module to display the process and input parameters. Although the system 800 is illustrated using a plurality of proximity heads to apply a plurality of application chemistries, it should be understood that variation of this system may be employed. For instance, the application chemistries, including gaseous chemistries, may be introduced through a single proximity head as a mixture or individually through plurality of inlet and outlet ports in the proximity head. The benefits in combining and applying the plurality of application chemistries include minimum contamination, minimum aging of low-k dielectric film layer, minimum process time and considerable cost reduction.

Figure 8:
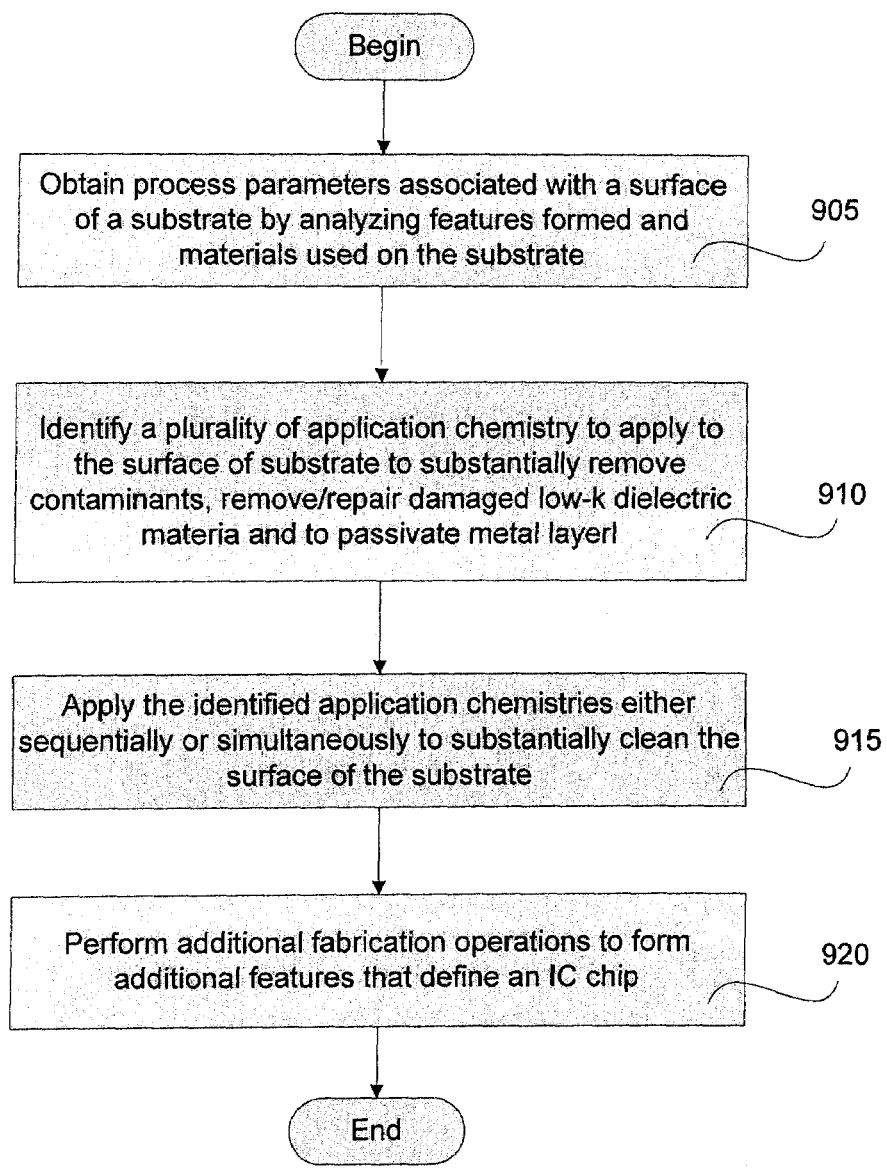
FIG. 8 represents a flowchart of operations involved in cleaning a surface of a substrate, in one embodiment of the invention.

With the above system configuration in mind, a method for cleaning a surface of a substrate to remove contaminants and restoring the characteristics of the damaged low-k dielectric film layer will now be described in detail with reference to FIG. 8. The method begins with identifying a plurality of process parameters associated with the surface of the substrate, as illustrated in operation 905. The process parameters may be obtained by analyzing the substrate surface, the features formed on the surface of the substrate, the contaminants formed on the substrate, the damage to the low-k dielectric film layer and type of chemistry used in the prior fabrication operations, such as etching operation.

The method proceeds to operation 910 wherein a plurality of application chemistries is identified. The application chemistries are used to remove contaminants and to remove/repair damaged low-k dielectric film layer without damaging the features formed on the substrate. The application chemistries include at least an emulsion of first application chemistry for substantially removing particulate contaminant and a second application chemistry having a wet cleaning chemistry to substantially remove polymer residue contaminants. The plurality of application chemistry may also include either a third application chemistry to remove damaged low-k dielectric film layer or a fourth application chemistry to repair the damaged low-k dielectric film layer without damaging the features formed in the vicinity. The application chemistries may further include a metal passivation chemical to passivate metal layer formed on the substrate so that the functionality of the device is maintained.

In operation 915, the selected application chemistries are applied to the surface of the substrate either sequentially or simultaneously to substantially remove the contaminants and remove/repair the damaged low-k dielectric film layer while providing passivation of metal layer to preserve the functionality of the features and characteristics of the material formed on the substrate. The application chemistries are applied by adjusting a plurality of input parameters associated with each of the application chemistry so as to provide optimal application chemistry to the surface of the substrate in order to obtain a substantially clean substrate surface. The input parameters may be adjusted automatically by using a software on a computing system.

Following the application of the various application chemistries, the surface of the substrate may be subjected to additional fabrication operations, as shown in operation 920, to further form additional features that define an integrated circuit chip (IC chip). The process may repeat till IC chips are formed on the substrate or some level of fabrication is reached.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for cleaning a surface of a substrate after an etching operation, comprising:
providing a first application chemistry having an emulsion of a first immiscible liquid combined with a second immiscible liquid, the second immiscible liquid dispersed in the form of droplets within the first immiscible liquid and a plurality of solid particles distributed throughout the first immiscible liquid;
providing a second application chemistry having a wet cleaning chemistry configured to substantially clean the surface of the substrate, the wet cleaning chemistry of the second application chemistry includes an organic solvent influenced to penetrate and swell polymer residue contaminants when brought proximal to the polymer residues, the organic solvent is a glycol ether compound, the second application chemistry includes about 1% to about 10% by weight of the glycol ether compound;
applying a mixture of the first and the second application chemistries directed toward the surface of the substrate using a plurality of inlet ports of a proximity head, flow of the first and the second application chemistries through the plurality of inlet ports controlled to provide a downward force so as to allow the solid particles within the first application chemistry to come within an interactive range of particle contaminants present on the surface of the substrate and allow the second application chemistry to penetrate and swell polymer residues present on the surface of the substrate,
wherein the downward force allows the solid particles within the first application chemistry to interact with the particle contaminants and the swollen polymer residues to substantially overcome adhesive forces holding the particle contaminants and the polymer residues to the surface of the substrate; and
removing the first and the second application chemistries along with the particle contaminants and the polymer residues released from the surface of the substrate through a plurality of outlet ports of the proximity head.

2. The method of claim 1, further comprising,
providing a third application chemistry for treating the surface of the substrate, the third application chemistry configured to substantially remove a damaged low-k dielectric film layer from the low-k dielectric material formed on the surface of the substrate; and
applying the third application chemistry to the surface of the substrate using the plurality of inlet ports of the proximity head by combining the third application chemistry with the mixture of the first and the second application chemistries.

3. The method of claim 1, further comprising,
providing a fourth application chemistry for treating the surface of the substrate, the fourth application chemistry configured to substantially repair a damaged dielectric film layer in the low-k dielectric material through which the features are formed, the fourth application chemistry includes a hydrocarbon group to repair the damaged dielectric film layer; and
applying the fourth application chemistry to the surface of the substrate using the plurality of inlet ports of the proximity head by combining the fourth application chemistry with the mixture of the first and the second application chemistries so as to expose the damaged dielectric film layer in the low-k dielectric material to the fourth application chemistry.

4. The method of claim 1, further comprising:
providing a fifth application chemistry for treating the surface of the substrate, the fifth application chemistry configured to enhance passivation of a metal layer formed on the substrate so as to substantially reduce damage to the metal layer; and
applying the fifth application chemistry to the surface of the substrate using the plurality of inlet ports by combining the fifth application chemistry with the mixture of the first and the second application chemistries.

5. The method of claim 1, wherein the glycol ether compound is selected from a group consisting of glycol monomethyl ether, ethylene glycol monoethyl ether, diethylene glycol monobutyl ether, or any combination thereof.

6. A method for cleaning a surface of a substrate after an etching operation, comprising:
providing a first application chemistry having an emulsion, the emulsion including a plurality of solid particles distributed within a continuous liquid medium of the first application chemistry;
providing a second application chemistry including an organic solvent, the organic solvent configured to penetrate and swell polymer residue contaminants when brought proximal to the polymer residues;
applying a mixture of the first and the second application chemistries to the surface of the substrate using a downward force, the downward force pushing the solid particles in the first application chemistry within an interactive range of particle contaminants present on the surface of the substrate and causing the organic solvent of the second application chemistry to penetrate and swell polymer residues present on the surface of the substrate, wherein the downward force allows the solid particles within the first application chemistry to interact with the contaminants and the swollen polymer residues to substantially overcome adhesive forces holding the contaminants and the polymer residues to the surface of the substrate; and removing the first and the second application chemistries along with the contaminants released from the surface of the substrate.

7. The method of claim 6, further includes,
applying a chemical dispersant to the first application chemistry so as to enable uniform dispersion of the solid particles within the first application chemistry.

8. The method of claim 6, wherein the continuous liquid medium includes a polar solvent, a non-polar solvent or a combination of the polar solvent and the non-polar solvent.

9. The method of claim 6, further includes,
providing a third application chemistry that is configured to substantially remove a damaged low-k dielectric film layer from the low-k dielectric material formed on the surface of the substrate,
wherein the third application chemistry is applied either sequentially after the application of the mixture of the first and the second application chemistries or simultaneously with the first and the second application chemistries by combining the third application chemistry with the mixture of the first application chemistry and the second application chemistry.

10. The method of claim 6, further includes,
providing a fourth application chemistry with a hydrocarbon group that is configured to substantially repair a damaged dielectric film layer in the low-k dielectric material through which the features are formed,
wherein the fourth application chemistry is applied either simultaneously with the first and the second application chemistries by combining with the mixture of the first and the second application chemistries or sequentially after the application of the mixture of the first and the second application chemistries, the application of the fourth application chemistry sufficiently exposing the damaged dielectric film layer in the low-k dielectric material to the fourth application chemistry.

11. The method of claim 6, further includes,
providing a fifth application chemistry for treating the surface of the substrate, the fifth application chemistry configured to enhance passivation of a metal layer formed on the substrate,
wherein the fifth application chemistry is applied to the surface of the substrate either sequentially after the application of the mixture of the first and the second application chemistries or simultaneously by combining the fifth application chemistry with the mixture of the first application chemistry and the second application chemistry.

12. The method of claim 6, wherein the organic solvent of the second application chemistry includes glycol ether compound selected from a group consisting of glycol monomethyl ether, ethylene glycol monoethyl ether, diethylene glycol monobutyl ether, or any combination thereof.

13. A method for cleaning a surface of a substrate after an etching operation, comprising:
providing a first application chemistry having an emulsion, the emulsion including a plurality of solid particles distributed within a continuous liquid medium of the first application chemistry;
providing a second application chemistry including an organic solvent, the organic solvent configured to penetrate and swell polymer residue contaminants when brought proximal to the polymer residues;

applying a mixture of the first and the second application chemistries toward the surface of the substrate using a plurality of inlet ports of a proximity head, flow of the first and the second application chemistries through the plurality of inlet ports controlled to provide a downward force to allow the solid particles in the first application chemistry to come within an interactive range of particle contaminants present on the surface of the substrate and to allow the organic solvent of the second application chemistry to penetrate and swell polymer residues present on the surface of the substrate, wherein the downward force allows the solid particles within the first application chemistry to interact with the contaminants and the swollen polymer residues to substantially overcome adhesive forces holding the contaminants and the polymer residues to the surface of the substrate; and removing the first and the second application chemistries along with the particle contaminants and the polymer residues released from the surface of the substrate through a plurality of outlet ports of the proximity head.

14. The method of claim 13, further comprising,
providing a third application chemistry that is configured to substantially remove a damaged low-k dielectric film layer from the low-k dielectric material formed on the surface of the substrate; and
applying the third application chemistry to the surface of the substrate simultaneously using the plurality of inlet ports of the proximity head by combining the third application chemistry with the mixture of the first and the second application chemistries or sequentially after the application of the mixture of the first and the second application chemistries, using a second set of inlet ports,
wherein the third application chemistry is removed using the plurality of outlet ports of the proximity head.

15. The method of claim 13, further comprising,
providing a fourth application chemistry having a hydrocarbon group that is configured to substantially repair a damaged dielectric film layer in the low-k dielectric material through which the features are formed; and
applying the fourth application chemistry to the surface of the substrate simultaneously using the plurality of inlet ports of the proximity head by combining the fourth application chemistry with the mixture of the first and the second application chemistries or sequentially after the application of the mixture of the first and the second application chemistries, using a third set of inlet ports so as to expose the damaged dielectric film layer in the low-k dielectric material to the fourth application chemistry,
wherein the fourth application chemistry is removed using the plurality of outlet ports of the proximity head.

16. The method of claim 13, further comprising:
providing a fifth application chemistry that is configured to enhance passivation of a metal layer formed on the substrate; and
applying the fifth application chemistry to the surface of the substrate simultaneously using the plurality of inlet ports of the proximity head by combining the fifth application chemistry with the mixture of the first and the second application chemistries or sequentially after the application of the mixture of the first and the second application chemistries, using a fourth set of inlet ports,
wherein the fifth application chemistry is removed using the plurality of outlet ports of the proximity head.

17. The method of claim 13, wherein the organic solvent of the second application chemistry includes glycol ether compound selected from a group consisting of glycol monomethyl ether, ethylene glycol monoethyl ether, diethylene glycol monobutyl ether, or any combination thereof.

* * * * *